United States Patent

Momose

Patent Number: 5,198,692
Date of Patent: Mar. 30, 1993

[54] SEMICONDUCTOR DEVICE INCLUDING BIPOLAR TRANSISTOR WITH STEP IMPURITY PROFILE HAVING LOW AND HIGH CONCENTRATION EMITTER REGIONS

[75] Inventor: Hisayo Momose, Tokyo, Japan

[73] Assignee: Kabushiki Kaisha Toshiba, Kawasaki, Japan

[21] Appl. No.: 714,986

[22] Filed: Jun. 14, 1991

Related U.S. Application Data

[63] Continuation of Ser. No. 460,804, Jan. 4, 1990, abandoned.

[30] Foreign Application Priority Data

Jan. 9, 1989 [JP] Japan .................. 1-2460

[51] Int. Cl.$^5$ .............. H01L 29/00; H01L 29/72; H01L 27/04
[52] U.S. Cl. ......................... 257/591; 257/557
[58] Field of Search .............. 357/34, 35, 48, 33; 307/22, 48

[56] References Cited

U.S. PATENT DOCUMENTS 3,585,464  6/1971  Castrucci et al. ............. 357/34 X
4,212,683  7/1980  Jones et al. .................. 148/1.5
4,833,509  5/1989  Hickox ......................... 357/35
4,935,375  6/1990  Kasper et al. ................. 357/35

FOREIGN PATENT DOCUMENTS 0241699  10/1987  European Pat. Off. .
2911726  10/1979  Fed. Rep. of Germany .
0035583   3/1977  Japan ........................... 357/34

OTHER PUBLICATIONS

Joshi et al., "Poly Emitter Bipolar Hot Carrier Effects in an Advanced BICMOS Technology", IEDM-87, 1987, pp. 182-185.

Primary Examiner—Hille Rolf
Assistant Examiner—Mahshid Saadat
Attorney, Agent, or Firm—Foley & Lardner

[57] ABSTRACT

In a semiconductor device including a bipolar transistor having a base region formed in a collector region, and an emitter region formed in the base region, the emitter region comprises a high concentration region in contact with the base region, and a low concentration region provided between the base region and the high concentration region. The low concentration region is formed by introducing an impurity with a mask including a large opening. In addition, the high concentration region is formed by introducing an impurity with a mask including a small opening.

9 Claims, 7 Drawing Sheets

SEMICONDUCTOR DEVICE INCLUDING BIPOLAR TRANSISTOR WITH STEP IMPURITY PROFILE HAVING LOW AND HIGH CONCENTRATION EMITTER REGIONS

This application is a continuation of application Ser. No. 07/460,804, filed Jan. 4, 1990 abandoned.

FIELD OF THE INVENTION

This invention relates to a semiconductor device including a bipolar transistor and a method of manufacturing the same.

BACKGROUND OF THE INVENTION

Figure 9A:
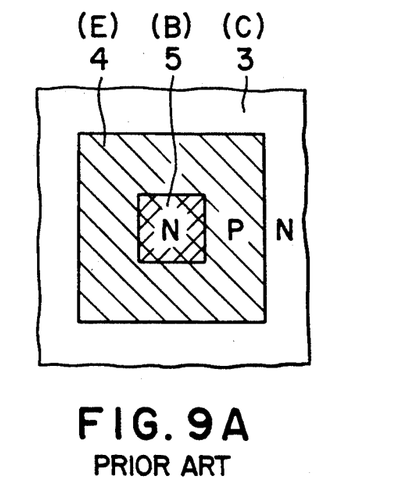
FIGS. 9A and 9B are a plan view and a cross sectional view of a background art.
Figure 9B:
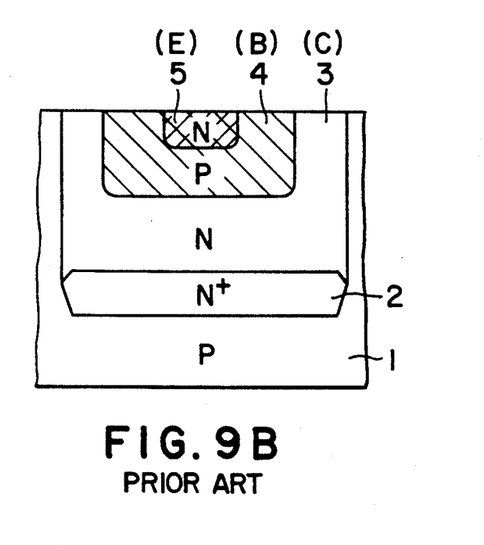

FIGS. 9A and 9B are a plan view and a cross sectional view of an NPN type bipolar transistor (Bi-Tr) as a portion of a conventional semiconductor device, e.g., Bi-CMOS, respectively. This Bi-Tr is manufactured as follows. Namely, an N+ type buried layer 2 is formed on a P-type Si substrate 1 and an N-type collector region 3 is grown thereon. A P-type impurity (B or $BF_2$, etc.) is ion-implanted into a region where the base is to be formed of the collector region 3. Thereafter, using a resist mark, an N-type impurity (e.g., As) is ion-implanted only into a region where the emitter is to be formed in the region where the base is to be formed. Heat treatment is then conducted. As a result, a P-type base region 4 is formed within the N-type collector region 3, and an N-type emitter region 5 is formed within the P-type base region 4. Thus, a Bi-Tr is provided.

There are instances where a reverse bias may be applied to the junction portion between the emitter region 5 and the base region 4 of the Bi-Tr. Application of such a reverse bias leads to the difficulty that the emitter-base junction breakdown voltage is lowered and the current gain $h_{FE}$ is also lowered, resulting in considerably deteriorated device characteristics.

SUMMARY OF THE INVENTION

This invention has been made in view of the above, and its object is to provide a semiconductor device constructed so that the device characteristic is not lowered even when a reverse bias is applied to the junction portion between the emitter region and the base region, and a method of manufacturing such a semiconductor device.

In the semiconductor device of this invention, the emitter region of the bipolar transistor is formed by two regions of the high concentration region and the low concentration region, and the interface between the high concentration region and the base region is surrounded by the low concentration region. Since such a structure is employed, the electric field at the edge portion of the emitter region is relaxed or reduced. Thus, even when a reverse bias is applied to the base-emitter junction portion, there is no possibility that the junction breakdown voltage and the current gain are lowered.

In accordance with a manufacturing method according to this invention, there is provided a semiconductor device including a bipolar transistor of a structure such that the emitter region is constituted by two regions of the high concentration region and the low concentration region, and that the low concentration region surrounds the interface between the high concentration region and the base region, i.e., a bipolar transistor which performs the above-mentioned action.

In accordance with this invention, even when a reverse bias is applied to the portion across the emitter region and the base region of the bipolar transistor, lowering of the device characteristic can be prevented.

DESCRIPTION OF THE PREFERRED EMBODIMENTS

Figure 1A:
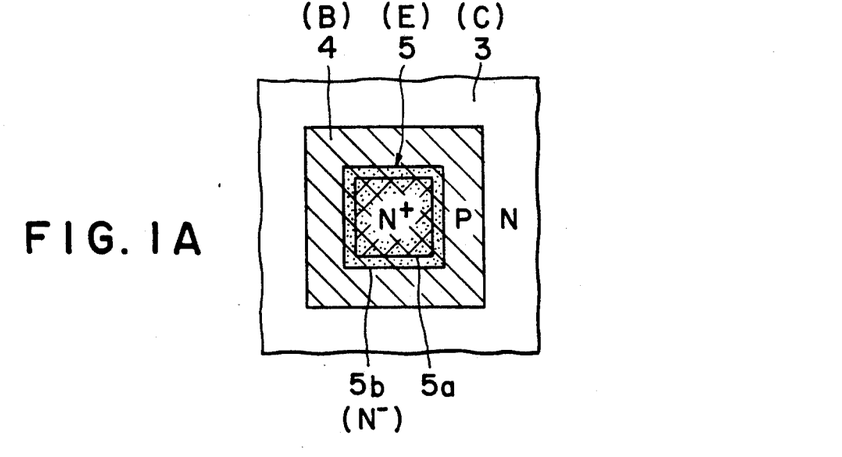
FIGS. 1A and 1B are a plan view and a cross sectional view of an embodiment according to this invention, respectively.
Figure 1B:
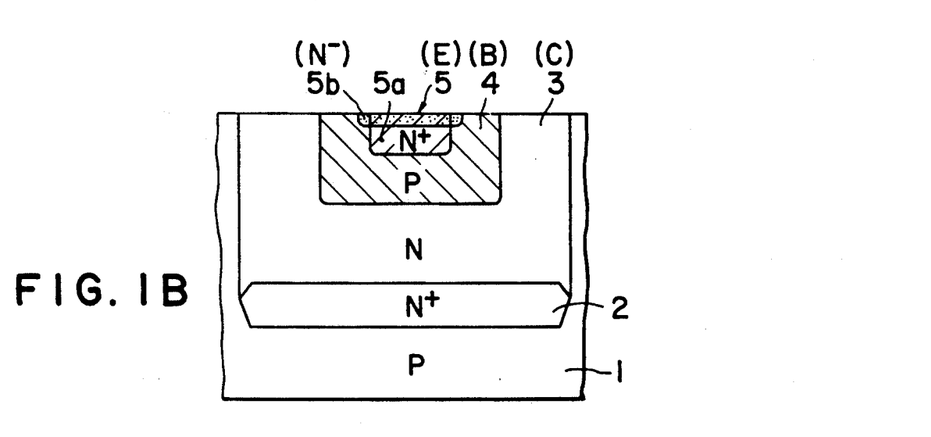

FIGS. 1A and 1B are a plan view and a cross sectional view of an NPN type Bi-Tr of a semiconductor device according to this invention, respectively. In this Bi-Tr, an N-type collector region 3 is formed on the side of the surface of an N+ buried layer 2 formed on a P-type semiconductor substrate 1. A P-type base region 4 is formed on the side of the surface of the collector region 3. Furthermore, an N-type emitter region 5 is formed on the side of the surface of the base region 4. This emitter region 5 is composed of two sections. One is a high concentration region (N+)5a having a small lateral cross section and a deep depth, and the other is a low concentration region (N−)5b having a large lateral cross section and a shallow depth.

In the Bi-Tr of such a structure, an N-type impurity diffused region (5b) having a low concentration is formed at the edge portion of a so-called conventional emitter region (5a) formed by N-type impurity having a high concentration. Thus, an electric field at the edge portion is relaxed. Even when a reverse bias is applied to the junction portion between the base and the emitter, the junction breakdown voltage and the current gain are not lowered. Thus, a high reliability device is provided.

The semiconductor device shown in FIGS. 1A and 1B is manufactured as follows.

Figure 2:
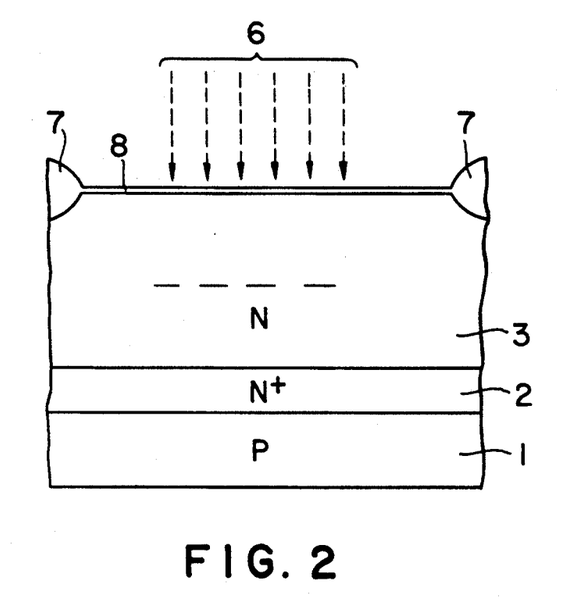
FIG. 2 and FIGS. 3A to 3D are cross sectional views showing an example of the manufacturing process steps.

Namely, as shown in FIG. 2, e.g., Sb is ion-planted into a P-type Si substrate 1 (e.g., 2Ω·cm) under the condition of 100 KeV, $1 \times 10^{15}$ cm$^{-2}$. A thermal process step under the condition of 1100° C., 60 minutes is implemented. An N+ buried layer 2 is thus formed. Thereafter, the surface of the Si substrate 1 is epitaxially grown in the atmosphere including $SiH_2Cl_2$. An N-type collector region 3 is thus formed. Then, device isolation regions 7, 7 are formed by LOCOS process. Thereafter, a silicon oxide film 8 having a thickness of approximately several ten to several hundred Å is formed by an argon diluted oxidation process. Thereafter, a P-type impurity (e.g., boron or $BF_2$) 6 is ion-implanted into a region where the base is to be formed under the condition of 25 KeV, $5 \times 10^{13}$ cm$^{-2}$.

Subsequently, process steps shown in FIGS. 3A to 3D are implemented in succession. These FIGURES show only the surface portion of the substrate shown in FIG. 2. As seen from FIG. 3A, a silicon oxide film 9 is deposited on the oxide film 8 in a manner in close contact therewith by a CVD process so that its thickness is equal to, e.g., 1,000 Å. Then, a resist (not shown) is coated on the silicon oxide film 9 in a manner in close contact therewith. By removing the portion of the resist, above a region where the emitter is to be formed, an opening is provided. Using this resist as a mask, by CDE (Chemical Dry Etching), openings 9a, 8a are provided in the silicon oxide films 9, 8, respectively. Then, that resist is exfoliated. Thus, the state shown in FIG. 3A results. Thereafter, using the silicon oxide films 9, 8 as a mask, an N-type impurity (e.g., As) 11 is densely ion-implanted through the openings 9a, 8a under the condition of 40 KeV, $5 \times 10^{15}$ cm$^{-2}$ so as to result in the state of high concentration.

Figure 3A:
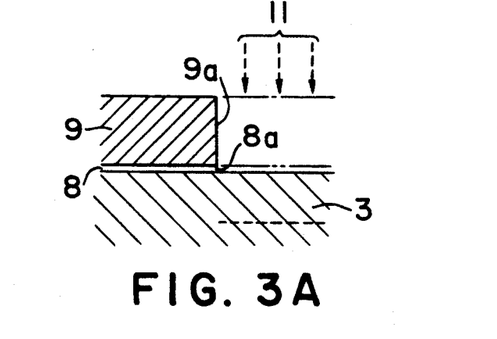
Figure 3B:
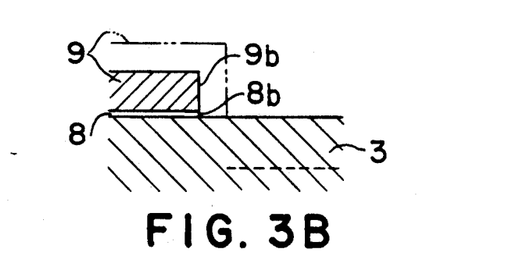

Then, as seen from FIG. 3B, the openings 9a, 8a of the silicon oxide films 9, 8 are widened, e.g., by 1,000 Å by wet etching process. Thus, larger openings 9b, 8b are newly provided.

Figure 3C:
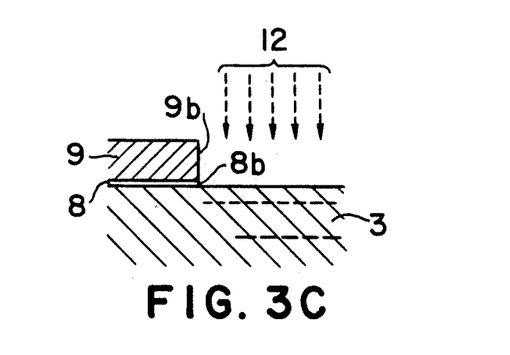

Then, as seen from FIG. 3C, an N-type impurity (e.g., P) 12 is sparsely ion-implanted under the condition of 20 KeV, $3 \times 10^{13}$ cm$^{-2}$ so as to result in the state of low concentration.

Figure 3D:
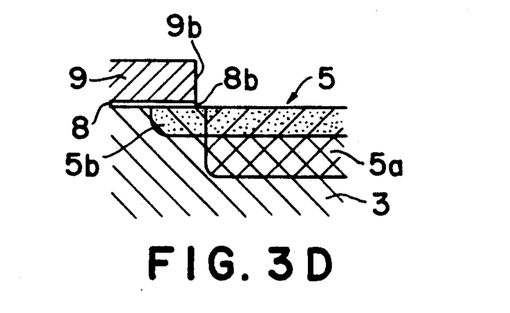

Subsequently, as seen from FIG. 3D, a thermal diffusion process, e.g., a process having a temperature of 900° C. and $N_2$ annealing time of 60 minutes is implemented. Thus, an emitter region 5 including an N-type high concentration region 5a and an N-type low concentration region 5b is formed within the P-type base region 4.

At times subsequent thereto, in the same manner as in widely used semiconductor devices, metallization process and passivation process are implemented in succession. Thus, a semiconductor device is provided.

A semiconductor device according to this invention may be manufactured by various methods described below in addition to the above-described method.

Namely, a first modification will be first described. After undergoing the process shown in FIG. 2, as seen from FIG. 4A, a resist film 21 is coated on the upper surface of the oxide film 8 in a manner in close contact therewith. The portion, above the region where the emitter is to be formed, of the resist film 21 is removed. An opening 21a is thus provided. Then, an N-type (e.g., As) is densely ion-implanted under the condition of 40 KeV, $5 \times 10^{15}$ cm$^{-2}$ so as to result in a state of high concentration.

Figure 4A:
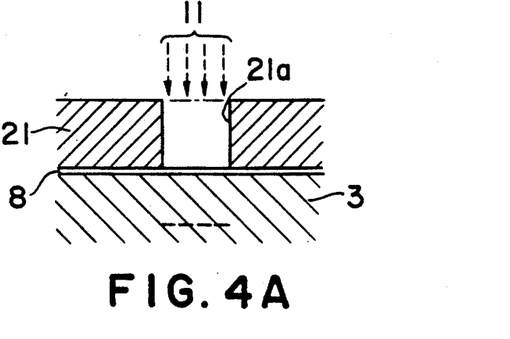
FIGS. 4A to 4D, FIG. 5, FIGS. 6A to 6E, FIGS. 7A to 7C, and FIGS. 8A to 8E showing different examples of the manufacturing process steps, respectively.
Figure 4B:
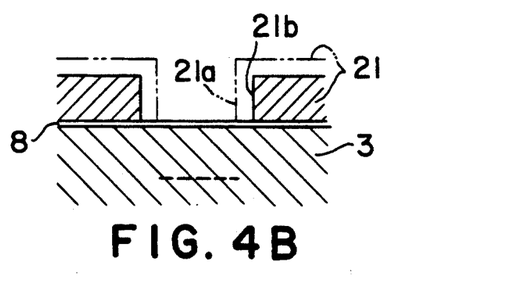

Then, as seen from FIG. 4B, the resist film 21 is etched by a wet etching process to further widen the opening 21a by 1,000 Å to newly form a larger opening 21b.

Figure 4C:
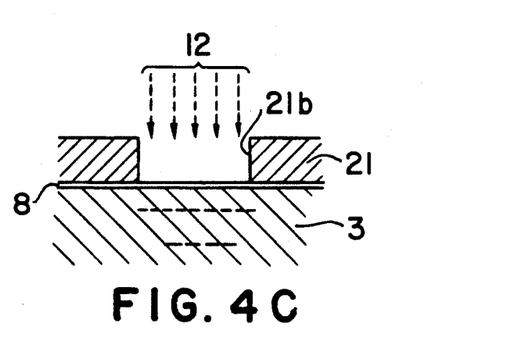

Then, as seen from FIG. 4C, an N-type impurity (e.g., P) 12 is sparsely ion implanted under the condition of 20 KeV, $3 \times 10^{13}$ cm$^{-2}$ so as to result in the state of low concentration.

Subsequently, as seen from FIG. 4D, the entirety of the resist film 21 is exfoliated. A thermal process similar to the thermal process in FIG. 3D is implemented. Thus, an N-type emitter region 5 including a high concentration region 5a and a low concentration region 5b is formed within the P-type base region 4.

Thereafter, a metallization process and a passivation process are implemented. Thus, a semiconductor device is provided.

A second modified embodiment will now be described.

Figure 5:
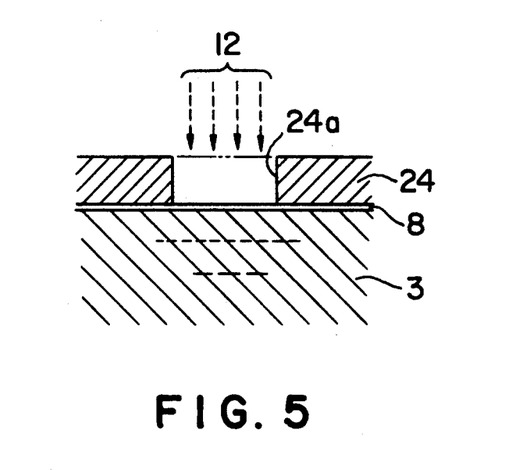

After the process step in FIG. 2 and the process in FIG. 4A, the entirety of the resist film 21 is exfoliated. Then, as shown in FIG. 5, a resist film 24 is coated on the oxide film 8. An opening 24a having substantially the same dimension as that of the opening 21b shown in FIG. 4B is provided in the resist film 24. Thereafter, an N-type impurity (e.g., P) 12 is sparsely ion-implanted under the condition of 20 KeV, $3 \times 10^{13}$ cm$^{-2}$ so as to result in a state of low concentration.

Figure 4D:
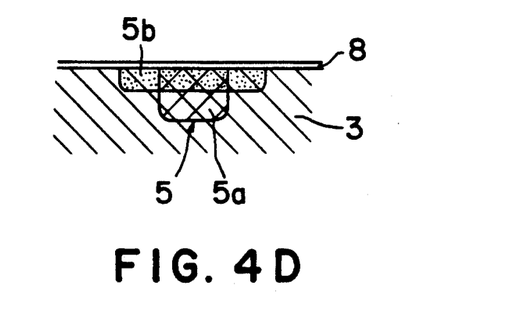

At times subsequent thereto, a semiconductor device is provided by executing the same process as that in FIG. 4D, the metallization process and the passivation process.

A third modified embodiment will now be described.

Figure 6A:
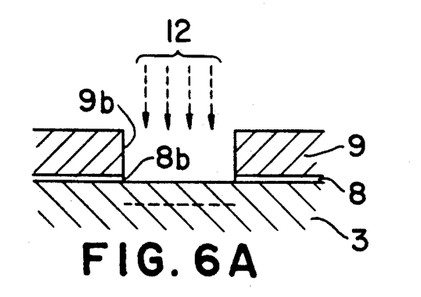
Figure 6B:
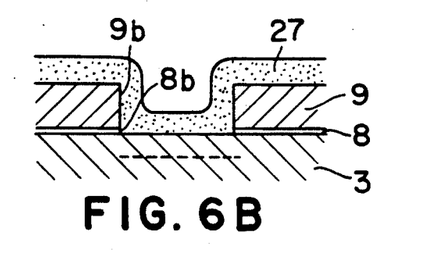

After the process step in FIG. 2, as seen from FIG. 6A, large openings 8b, 9b are provided in the oxide films 8, 9, respectively, and an N-type impurity 12 is introduced sparsely through these openings 8b, 9b so as to result in a state of low concentration. Thereafter, as seen from FIG. 6B, a polycrystalline silicon oxide film 27 is deposited on the oxide films 8, 9 in a manner in close contact therewith so that its thickness is equal to, e.g., 1,000 Å.

Figure 6C:
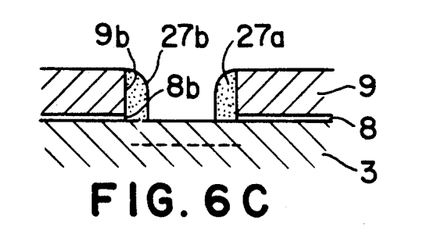

Then, as seen from FIG. 6C, a polycrystalline silicon oxide film 27a is left only within the openings 8b, 9b by anisotropic etching to form an opening 27b. Thereby, an opening 27b is formed.

Figure 6D:
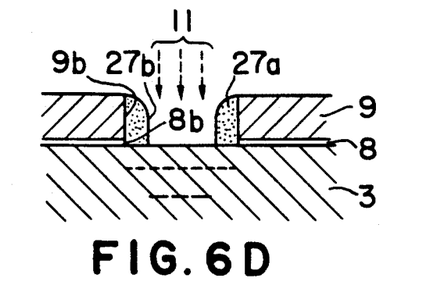

Then, as seen from FIG. 6D, using the polycrystalline silicon oxide film 27a as a mask, an N-type impurity (e.g., P) 11 is densely ion-implanted under the condition of 40 KeV, $5 \times 10^{15}$ cm$^{-2}$ so as to result in the state of high concentration.

Figure 6E:
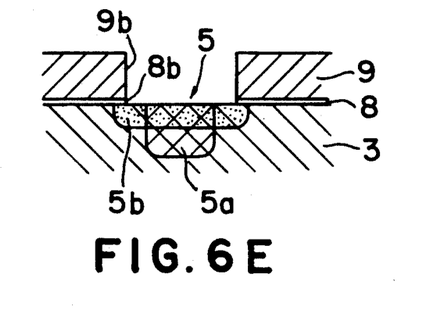

Then, as seen from FIG. 6E, the remaining polycrystalline silicon oxide film 27a is removed by a dry etching process.

Subsequently, process steps similar to those shown in FIG. 3D, i.e., the thermal process step, the metallization process step, and the passivation process step will be carried out.

In the abovementioned third modified embodiment, a $SiO_2$ film can be used instead of the polycrystalline silicon film 27. In this case, it is free that the remaining $SiO_2$ film in the openings 8b, 9b may be either removed or left as it is.

A fourth modified embodiment will now be described.

Figure 7A:
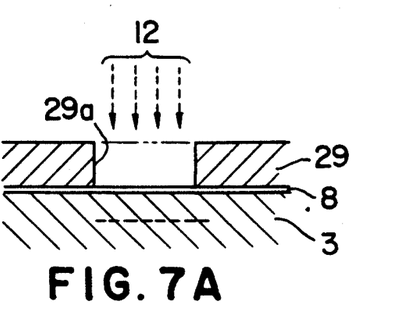

After the process step shown in FIG. 2, as seen from FIG. 7A, a resist film 29 is coated on the oxide film 8 in a manner in close contact therewith. Only the portion, above the region where the emitter is to be formed, of the resist film 29 is removed to provide a large opening 29a. Thereafter, an N-type impurity (e.g., P) 12 is sparsely ion-implanted through the opening 29a under the condition of 20 KeV, $3 \times 10^{13}$ cm$^{-2}$ so as to result in a state of low concentration.

Figure 7B:
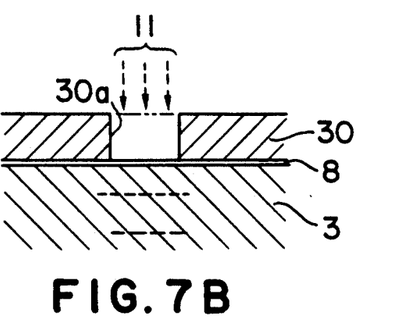

Then, as seen from FIG. 7B, after the entirety of the resist film 29 is exfoliated, a resist film 30 is coated. The portion, above the region where the high concentration region is to be formed, of the resist film 30 is removed to provide a small opening 30a. Thereafter, an N-type impurity (e.g., As) 11 is densely ion-implanted under the condition of 40 KeV, $5 \times 10^{15}$ cm$^{-2}$ so as to result in a state of high concentration.

Figure 7C:
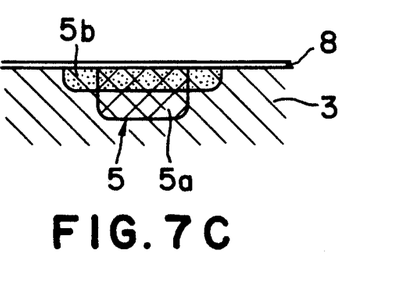

Then, as seen from FIG. 7C, the entirety of the resist film 30 is exfoliated. Thereafter, the thermal process, the metallization process and the passivation process are implemented.

Finally, a fifth embodiment will be described.

Figure 8A:
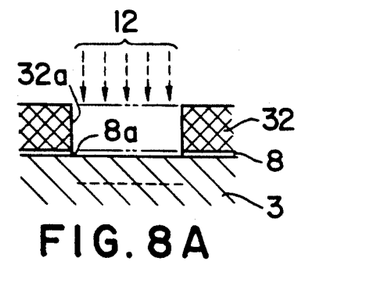

After the process step shown in FIG. 2, as seen from FIG. 8A, a silicon oxide film 32 is deposited on the oxide film 8 in a manner in close contact therewith by a CVD process so that its thickness is equal to, e.g., 1,000 Å. A resist (not shown) is coated on the oxide film 32 in a manner in close contact therewith. Thereafter, only the portion, above the region where the emitter is to be formed, of the resist is removed to provide an opening.

Then, using this opening as a mask, large openings 32a, 8a are provided in the silicon oxide film 32, 8 by CDE process, respectively. Thereafter, an N-type impurity (e.g., P) 12 is sparsely ion-implanted through these openings 32a, 8a under the condition of 20 KeV, $3 \times 10^{13}$ cm$^{-2}$ so as to result in a state of low concentration.

Figure 8B:
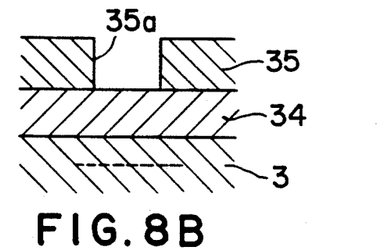

Then, as seen from FIG. 8B, after the oxide films 32, 8 are removed by wet etching process, another oxide film 34 is deposited by a CVD process so that its thickness is equal to 3,000 Å. Thereafter, a second resist film 35 is coated on the oxide film 34. An exposure process is implemented thereto to form an opening 35a.

Figure 8C:
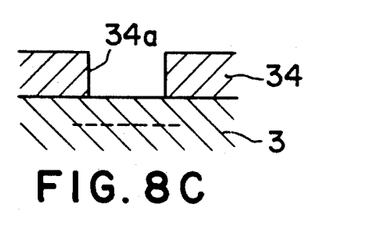

Then, as seen from FIG. 8C, an opening 34a is provided in the oxide film 34 by CDE process. Thereafter, the entirety of the resist 35 is exfoliated.

Figure 8D:
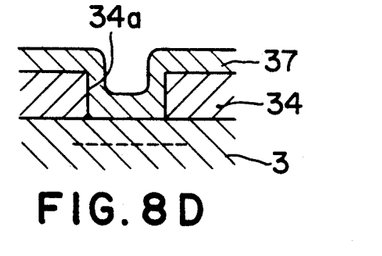

Then, as seen from FIG. 8D, a polycrystalline silicon film 37 including an N-type impurity (e.g., P) is deposited on the silicon oxide film 34 in a manner in contact therewith so that its thickness is equal to, e.g., 2,000 Å.

Figure 8E:
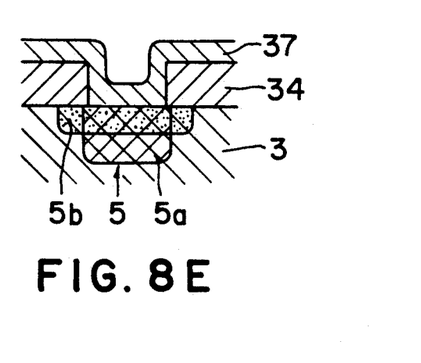

Then, as seen from FIG. 8E, the heat treatment process, the metallization process and the passivation process are implemented. In the above-mentioned heat treatment process, the N-type impurity in the polycrystalline silicon film 37 is diffused. A high concentration region 5a is thus formed.

As a mask in ion-implanting the N type impurity, a nitride film may be used instead of the above-mentioned silicon oxide film and resist film.

As the N-type impurity, Sb may be used instead of the above-mentioned P and As.

Figure 1C:
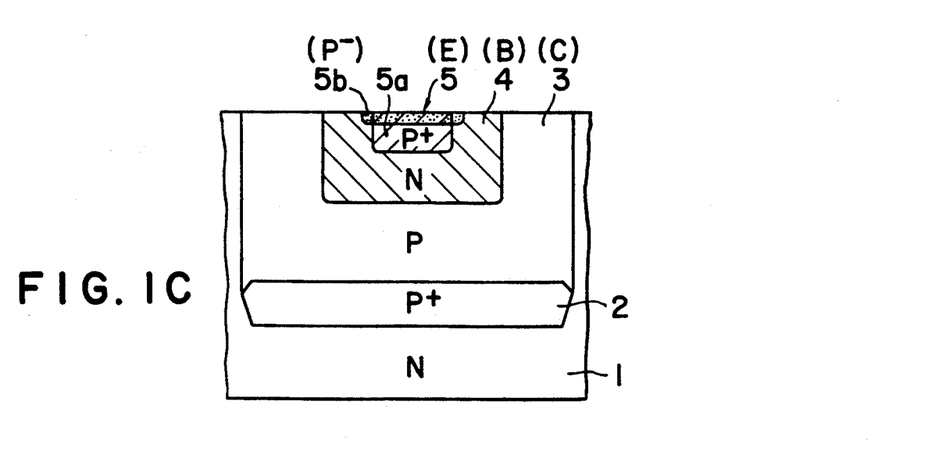
FIG. 1C is a cross sectional view of other embodiment according to this invention.

While a Bi-Tr including NPN transistor has been described above, Bi-Tr including PNP transistor may be obtained in the same manner as stated above by allowing the conductivity to be opposite to the above. Another embodiment of the present invention is shown in FIG. 1C.

Figure 10:
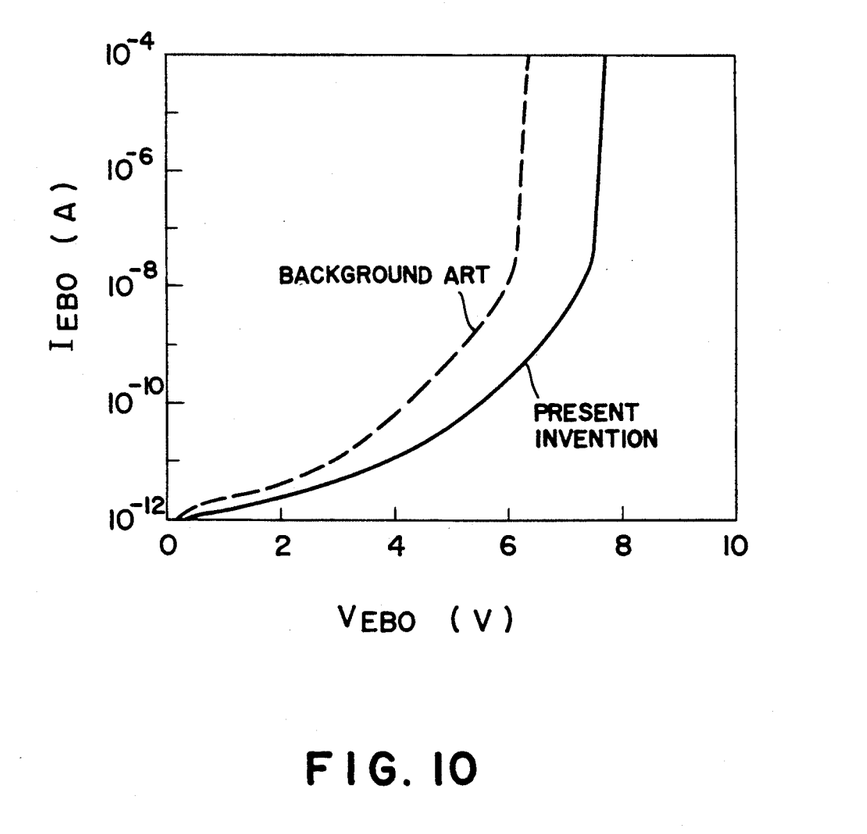
FIG. 10 shows the emitter-base junction initial characteristics of the semiconductor devices according to the present invention and the background art.
Figure 11A:
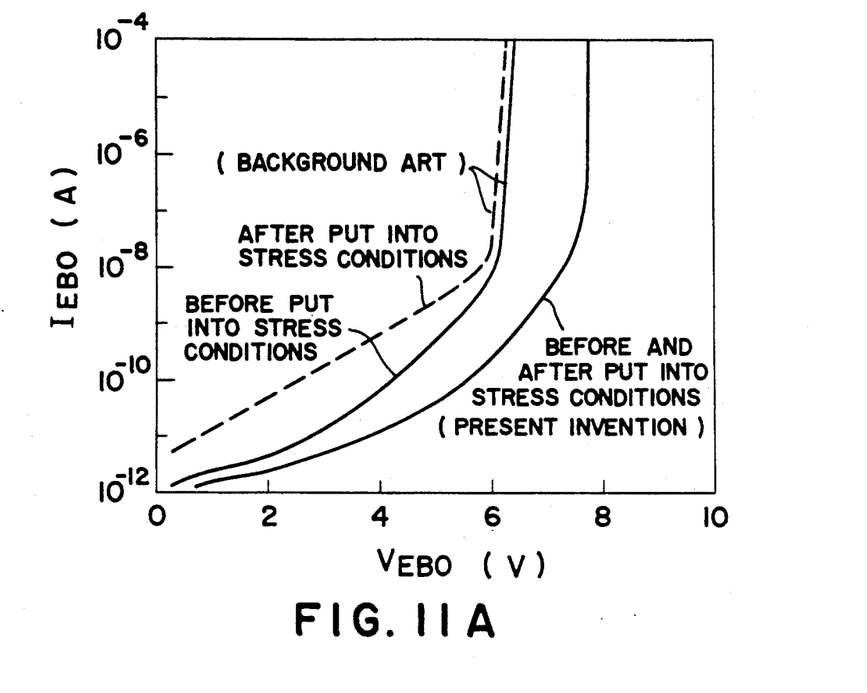
FIG. 11A shows changes of the emitter-base junction characteristics of the semiconductor devices according to the present invention and the background art after putting the devices into reverse bias stress conditions.
Figure 11B:
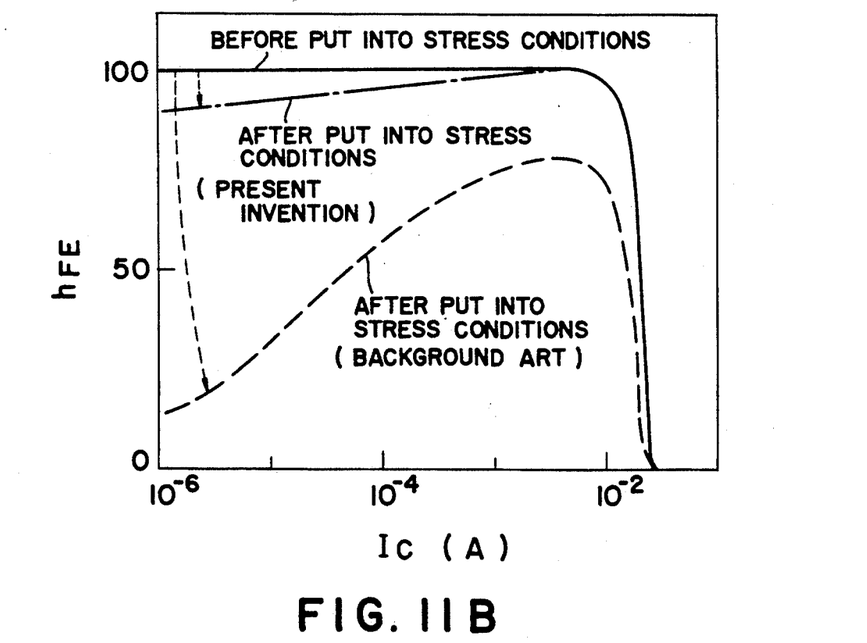
FIG. 11B shows changes of the current gain characteristics of the semiconductor devices according to the present invention and the background art after putting them into reverse bias stress conditions.

FIGS. 10 to 11B show the advantageous effects of the present invention. Especially, it will be understood from FIG. 11A that the emitter-base junction characteristics of the semiconductor device according to the present invention does not practically change even if the device is put into reverse bias stress conditions ($V_{EBO}$=5V, 1,000 sec), while the characteristics of the device according to the background art change widely. Furthermore, it will be understood from FIG. 11B that the current gain characteristics of the device according to the present invention changes only slightly if the device is put into the aforementioned conditions, while the characteristics of the device according to the background art changes greatly.

What is claimed is:

1. A semiconductor device including a semiconductor substrate, and a bipolar transistor formed in said semiconductor substrate, said bipolar transistor comprising:

a collector region comprising a first conductivity type impurity;

a base region comprising a second conductivity type impurity and formed in the vicinity of the surface of said collector region, and an emitter region comprising said first conductivity type impurity and formed in the vicinity of the surface of said base region, said emitter region comprising a high concentration region having a high impurity concentration and a low concentration region having an impurity concentration considerably lower than that of said high concentration region, said high and low concentration regions being in columnar form, said columnar low concentration region having a lateral cross section considerably larger than that of said high concentration region and a depth considerably smaller than that of said high concentration region, said high and low concentration regions being superimposed so that said low concentration region comprises a central columnar portion superposed on a surface portion of said high concentration region and a peripheral annular portion surrounding said central columnar portion and said surface portion of said high concentration region, said peripheral annular portion surrounding the first interface portion, between said high concentration region and said base region, said first interface portion being in the vicinity of the surface of said substrate, said peripheral annular portion not surrounding the second interface portion between said high concentration region and said base region, said second interface portion being adjacent to the first interface portion, said peripheral annular portion being automatically formed by said columnar high and low concentration regions being formed annular in a manner to surround the first interface portion between said high concentration region and said base region, which is in the vicinity of the surface of said substrate and so as not to surround the second interface portion between said high concentration region and said base region, which is adjacent to the first interface portion, said low concentration region being automatically formed by forming said high concentration region and a columnar low concentration region, said columnar low concentration region having a lateral cross section larger than that of said high concentration region and a depth smaller than that of said high concentration region;

whereby said emitter region essentially comprises high concentration impurities, the volume of said low concentration region being exceedingly smaller than that of said high concentration impurity region.

2. A device as set forth in claim 1, wherein said high concentration region is formed as a quadrangular column, and said low concentration region is formed as a quadrangular frame.

3. A device as set forth in claim 1, wherein said semiconductor substrate is a substrate comprised of said second conductivity type impurity, and said collector region is a well region formed in said substrate.

4. A device as set forth in claim 2, wherein said semiconductor substrate is a substrate comprised of said second conductivity type impurity, and said collector region is a well region formed in said substrate.

5. A device as set forth in claim 1, wherein said first conductivity type impurity is an N-type impurity, and said second conductivity type impurity is a P-type impurity.

6. A device as set forth in claim 2, wherein said first conductivity type impurity is an N-type impurity, and said second conductivity type impurity is a P-type impurity.

7. A device as set forth in claim 1, wherein said first conductivity type impurity is a P-type impurity, and said second conductivity type impurity is an N-type impurity.

8. A device as set forth in claim 2, wherein said first conductivity type impurity is a P-type impurity, and said second conductivity type impurity is an N-type impurity.

9. A semiconductor device including a semiconductor substrate and a bipolar transistor formed in such semiconductor substrate, said bipolar transistor comprising:

a collector region formed of a first conductivity type impurity;

a base region formed of a second conductivity type impurity; and an emitter region formed of the first conductivity type impurity and comprising a high impurity concentration emitter region having a high impurity concentration and a low impurity concentration emitter region having a low impurity concentration, the low impurity concentration being significantly lower than said high impurity concentration, said high impurity concentration emitter region forming a columnar shaped electrode in the base region, said low impurity concentration emitter region forming a columnar low concentration region in the base region, a portion of the low impurity concentration emitter region surrounding an upper portion of a sidewall of the high impurity concentration emitter region, said upper portion being in the vicinity of the surface of said substrate;

said emitter region essentially comprising high concentration impurities, the volume of said low impurity concentration emitter region being exceedingly smaller than that of said high impurity concentration emitter region.

* * * * *